United States Patent [19]

Dingwall et al.

[11] 4,072,910
[45] Feb. 7, 1978

[54] VOLTAGE CONTROLLED OSCILLATOR HAVING EQUALLY CONTROLLED CURRENT SOURCE AND CURRENT SINK

[75] Inventors: Andrew Gordon Francis Dingwall, Bridgewater, N.J.; Bruce David Rosenthal, Mountain View, Calif.

[73] Assignee: RCA Corporation, New York, N.Y.

[21] Appl. No.: 783,657

[22] Filed: Apr. 1, 1977

[30] Foreign Application Priority Data

Apr. 9, 1976 United Kingdom ............... 14608/76

[51] Int. Cl.² .......................... H03B 5/02; H03B 5/12
[52] U.S. Cl. .................................. 331/57; 331/108 B; 331/108 C; 331/108 D; 331/117 R; 331/177 R
[58] Field of Search ............ 331/34, 36 R, 57, 108 R, 331/108 A, 108 B, 108 C, 108 D, 117 R, 135, 177 R; 332/9 T, 16 T, 29 R

[56] References Cited

U.S. PATENT DOCUMENTS

| 3,878,482 | 4/1975 | Schowe, Jr. | 331/108 D |
|---|---|---|---|
| 3,904,988 | 9/1975 | Hsiao | 331/108 C X |
| 3,931,588 | 1/1976 | Gehweiler | 331/57 |

Primary Examiner—Siegfried H. Grimm
Attorney, Agent, or Firm—H. Christoffersen; H. I. Schanzer

[57] ABSTRACT

The VCO circuit includes means for varying the potential across an inverting stage of a ring oscillator for changing its frequency of oscillation, while maintaining the quiescent point of the stage output centered between the two operating voltages powering the circuit. A current source is connected between the more positive of the two operating voltages and the positive voltage terminal of the stage and a current sink is connected between the more negative of the two operating voltages and the negative voltage terminal of the stage. The current supplied by the current source and the current drawn by the current sink are proportional to an input control voltage and are equal in magnitude. The oscillator stage is biased in the linear portion of its transfer characteristic and provides a conduction path between the current source and the current sink.

8 Claims, 4 Drawing Figures

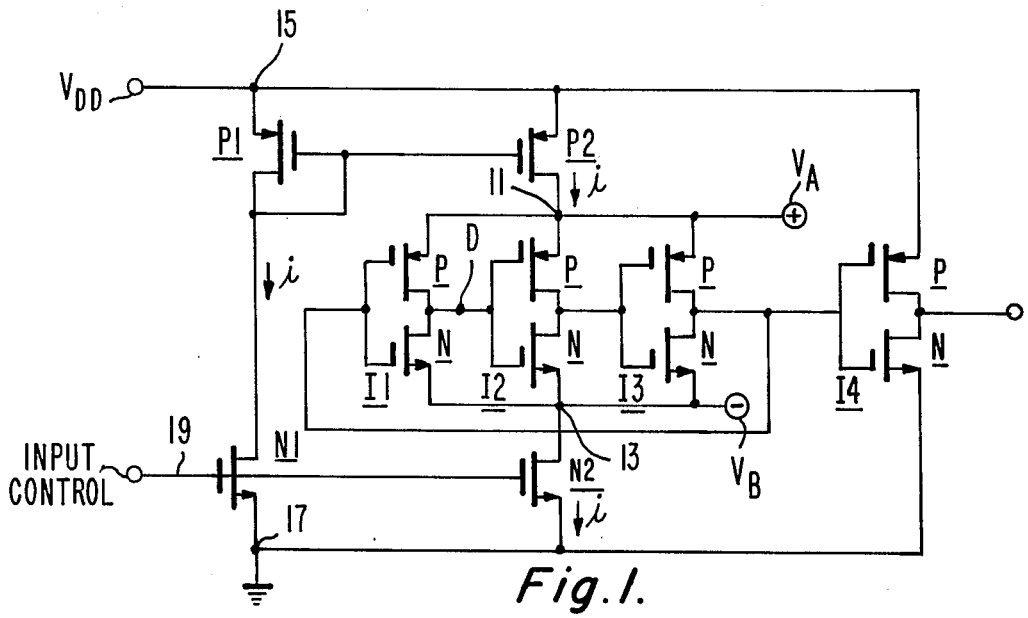
Fig.1.
Fig.2.
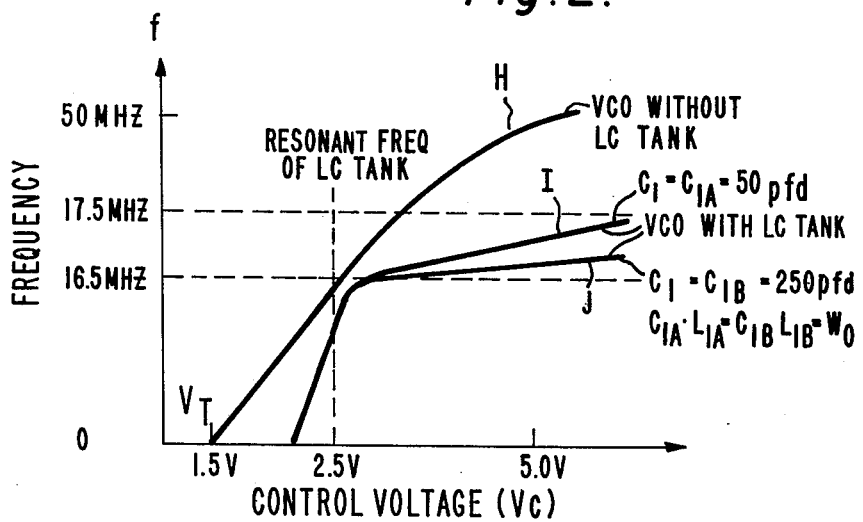
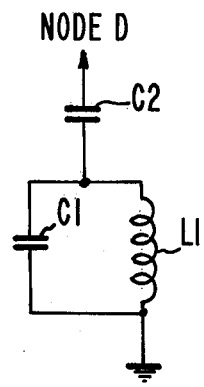
Fig.3.
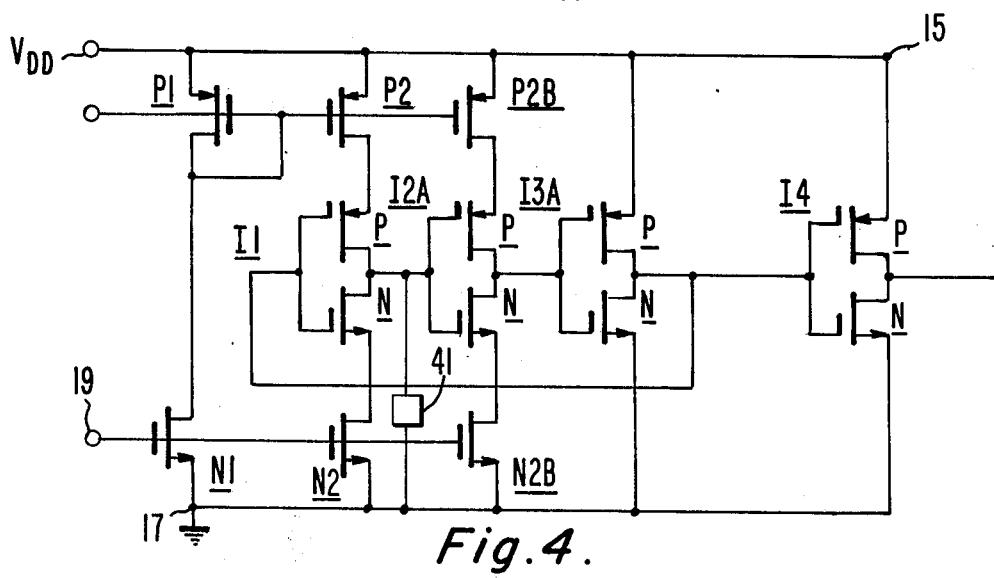
Fig.4.

VOLTAGE CONTROLLED OSCILLATOR HAVING EQUALLY CONTROLLED CURRENT SOURCE AND CURRENT SINK

This invention relates to an oscillator whose output frequency varies as a function of its applied voltage and to means for varying the potential applied to the oscillator without significantly altering the quiescent voltage about which the oscillator output varies.

VCO circuits produce output signals whose frequency varies as a function of an input control voltage. VCOs are useful in systems employing phase locked loops (PLL) as well as in any system where a variable frequency output signal is required as a function of input signal. A VCO circuit employing cascaded inverters connected in a ring configuration to form a ring oscillator is described, for example, in U.S. Pat. No. 3,931,588 entitled "Voltage Controlled Oscillator Utilizing Field Effect Transistors" issued to W. F. Gehweiler. In this reference the frequency of the ring oscillator is varied by varying the operating voltage applied across at least one of the inverting stages of the oscillator.

However, in the cited reference, when the operating voltage to the oscillator is varied there is also a change in the quiescent or operating point of one or more of the oscillator inverter stages. This limits the maximum signal amplitude that can be obtained without distortion and may require level shifting of the stage output. In this application, the quiescent or operating point, $V_Q$, is defined as the steady state value of voltage at the output of an inverting stage about which the signal oscillates or varies.

In the Gehweiler reference, each stage of the ring oscillator includes a complementary inverter connected via a transistor 10 of P-conductivity type to a positive supply ($V_{DD}$) and via a transistor 16 of N conductivity type to the negative supply ($V_{SS}$). The same control voltage ($V_C$) is applied to the gates of the P and N transistors which are connected in common. As $V_C$ increases from $V_{SS}$ to $V_{DD}$ the impedance of the P transistor increases and the impedance of the N transistor decreases and vice versa for the condition of $V_C$ decreasing from $V_{DD}$ to $V_{SS}$. Consequently, the P and N transistors have the same impedance for only one intermediate value of signal and hence $V_Q$ at the output of the inverter varies as a function of variations in $V_C$. This makes it extremely difficult to couple to succeeding stages. Another disadvantage is that the output frequency does not decrease or increase monotonically with $V_C$. As shown in FIG. 10 of the reference, the frequency of oscillation increases and then decreases as $V_C$ varies between $V_{SS}$ and $V_{DD}$. This is a severe disadvantage in PLL systems since for different values of control voltage the system would be operated at the same frequency. Clearly, the resultant frequency output is not a monotonic function (i.e. a single valued function) of the control voltage.

A VCO circuit employing cascaded inverters to form an astable multivibrator is described, for example, in U.S. Pat. No. 3,878,482 entitled "Wide-Band, Voltage Controlled Oscillator Utilizing Complementary Metal Oxide Semiconductor Integrated Circuits and a Constant Current MOS-Field Effect Transistor", issued to L. F. Schowe, Jr. In the Schowe Jr. reference, the operating current and voltage is supplied to a complementary inverter 13 via a transistor of P-conductivity type Q1 functioning as a current source. As the conduction of the P-type transistor is varied more or less current flows into the inverter. But, due to the asymmetrical drive, the quiescent voltage at the inverter output is also constantly varying.

Another reference, U.S. Pat. No. 3,904,988 entitled "CMOS Voltage Controlled Oscillator", issued to Hsiao shows, in FIG. 6 thereof, a current source 134 and a current sink 112 coupled via a complementary inverter control switch 14 to a timing capacitor 12. This reference teaches the switching of the complementary switch 14 to charge or discharge the timing capacitor 12.

A bi-valued digital signal V is applied to the input (gates of transistors) of the current switch 14. Switch 14 is, thus, not operated in its linear region. Rather, for one value (low) of the input the current source 134 is connected via an extremely low impedance to the timing capacitor and the current sink 112 is virtually disconnected from the capacitor. For the other value (high) of the input, the current sink is connected via an extremely low impedance to the timing capacitor and the current source is decoupled therefrom. There is no intention to apply a voltage across the complementary switch 14 to control its operation and operate it as an amplifier. This is made clear by reference to FIG. 1 of the reference which shows complementary configuration 14 as a two position switch. This reference thus teaches the coupling of one of a current source and a current sink to a capacitor, then sensing the potential across the capacitor, and then activating a switch to couple the other one of the current source and sink to the capacitor. These operations introduce many delays in the operation rendering the circuit unsuitable for high frequency applications.

Furthermore, the output is triangular rather than being a sinusoid which is desirable in radio and similar applications. Since the capacitor is driven from only one current source at a time it is difficult to get fine frequency control. The sharply non-linear operation renders the use of tuned circuits to obtain fine frequency control either ineffective or inefficient. The Hsiao reference thus does not teach the operation of the inverter 14 in its linear range and suffers from limitations in speed and high frequency response, in the inability to fine control and tune the frequency output and in the inability to produce a sinusoidal signal.

A circuit embodying the invention includes an oscillator whose output frequency varies as a function of its applied voltage and which has first and second voltage terminals for the application therebetween of a varying voltage. The circuit includes a current source connected between a first power terminal and the first voltage terminal and a current sink connected between a second power terminal and the second voltage terminal. The current source and the current sink are responsive to an input control voltage and produce currents of equal magnitude. The oscillator includes one or more inverting stages connected between the current source and the current sink, which are operated in the linear region of their transfer characteristics and which have a quiescent point which remains, approximately, midway between the voltages applied to the first and second power terminals.

In the drawing:

FIG. 1 is a schematic diagram of a VCO circuit embodying the invention;

FIG. 2 is a diagram showing the frequency response curves of the circuits of FIGS. 1 and 3 as a function of a control input voltage;

FIG. 3 is a schematic diagram of a tank circuit which may be used to control the frequency response of the circuit of FIG. 1; and FIG. 4 is a schematic diagram of another VCO circuit embodying the invention.

The VCO circuit of FIG. 1 includes three complementary inverters (I1, I2 and I3) interconnected to form a ring oscillator, a P-IGFET P2 connected to function as a controlled current source, an N-IGFET N2 connected to function as a controlled current sink, and means responsive to an input control signal applied to terminal 19 for controlling the currents delivered by that current source and demanded by that current sink so they track each other over a range of variation. This means is provided by the connection of N-IGFET N1 as a common-source amplifier with self-biased P-IGFET P1 as a collector load, by the paralleling of the source-to-gate circuits of N1 and N2, and by the paralleling of the source-to-gate circuits of P1 and P2. This tracking of the source and sink currents so they are maintained substantially equal over their entire range of adjustment is the key to the VCO having a monotonic frequency versus input control signal characteristics.

Each one of the inverters I1, I2 and I3 includes a P-IGFET and an N-IGFET. The gates of the two IGFET's of each inverter are connected to the inverter input and their drains are connected to the inverter output. The output of the inverter I1 is connected to the input of inverter I2, the output of I2 is connected to the input of inverter I3, and the output of I3 is connected back to the input of I1. The sources of the P-IGFET's are connected to terminal 11 at which is developed a potential denoted $V_A$ and the sources of the N-IGFET's are connected to terminal 13 at which is developed a potential denoted $V_B$.

The three inverters oscillate at a rate determined by the capacitance at the input and output of each inverter, the potentials across the inverters ($V_A-V_B$), the currents flowing through the inverting stages (since the stage current determines the rate at which nodal capacitances can be charged or discharged), the open loop gain, and the frequency response of the transistors forming the inverters. Ring oscillators comprising three cascaded complementary inverters were built and when operated at 10 volts oscillated in a free running mode in the range of 100 MHz. This invention enables these high frequency oscillators to be run in a controlled manner. One of these oscillators employed transistors made by self-aligned bulk silicon process and another one of these oscillators employed transistors formed by a silicon-on-sapphire (SOS) process.

Assuming a given manufacturing process and a given circuit capacitance, the frequency of the ring oscillator can be varied by controlling the potential applied across or the current applied to the ring oscillator stages.

The operating potential applied to the ring oscillator is generated by the network comprised of transistors P1, N1, P2 and N2. The sources of transistors P1 and P2 are connected to terminal 15 to which is applied $V_{DD}$ volts, and their gates are connected to the drains of transistors P1 and N1. The sources of transistors N1 and N2 are connected to terminal 17 which is grounded, and their gates are connected to input terminal 19 to which is applied a control input signal $V_C$. The ring oscillator circuitry is connected between the drains of transistors P2 and N2. The output G of the ring oscillator is connected to the input of a complementary inverter I4 which is connected between the full power supply lines 15 and 17.

When $V_C$ applied to terminal 19 exceeds the threshold voltage $V_T$ of transistor N1, N1 is turned on and conducts a current. Since the conduction path of transistor P1 is in series with that of N1, P1 passes the current flowing through N1. The current flowing through P1 causes a gate-to-source voltage $V_{GS}$ to be developed between the gate and source of P1. The $V_{GS}$ of P1 is applied across the gate and source of P2 since the gate-to-source of P2 is in parallel with that of P1. Assuming P1 and P2 to have substantially the same geometries, P2 will conduct a similar current passed by P1.

$V_C$ is also applied to the gate of transistor N2. Assuming transistor N2 to have substantially the same geometry as N1, N2 will conduct a current having a magnitude as the one through N1, and this current is equal in magnitude to the current through P2. Transistor P2 functions as a current source supplying a current into node 11. Transistor N2 functions as a current sink drawing from node 13 a current which is substantially equal to the current being sourced into node 11.

As the input control voltage $V_C$ increases above $V_T$, the magnitude of the current through P2 and N2 increases monotonically. Simultaneously, the voltage, $V_A$, at node 11 becomes more positive and the voltage $V_B$, at node 13 becomes more negative. Therefore, as $V_C$ increases the potential across the oscillator inverters increases. Vice-versa, as $V_C$ decreases towards $V_T$ less current flows through P2 and N2 and the voltage across the oscillator ($V_A-V_B$) decreases.

Transistors P2 and N2 may also be viewed as a pair of electronically controlled conductances; and, indeed functioning as such, they serve to center the quiescent operating point of the oscillator inverters.

For the same current flowing through P2 and N2 and assuming their design to be such that their effective source-to-drain impedances are equal, then, their source-to-drain voltage $V_{DS}$ will also be approximately equal. Consequently, the voltage drop between terminals 15 and 11 ($V_{DD}-V_A$) is approximately equal to the voltage drop between terminals 13 and 17 ($V_B$). So long as the symmetry is maintained, $V_A$ and $Vk_B$ will be equidistant in potential from their associated power terminals 15 and 17.

For best performance of the ring oscillator it is preferable that the two transistors of each inverter stage be balanced. That is, for the same source-drain current $I_{DS}$ flow, their drain-to-source voltage $V_{DS}$ should be the same. Assuming this condition to be met, the quiescent voltage $V_Q$ of each oscillator inverter is then midway between the potential $V_A$ on line 13. Assuming P2 and N2 to also be balanced, then the $V_Q$ of each oscillator inverter is also midway between $V_{DD}$ and ground. This is so regardless of how small or how large the oscillator voltage ($V_A-V_B$) is made. It is important to emphasize that the three oscillator inverters are operated approximately 120° out-of-phase with respect to each other. As a result, an approximately constant current flows through the oscillator circuit between the drain of P2 and the drain of N2. Consequently, for the circuit of FIG. 1, the potential on lines 11 and 13, which may be termed the subsidiary-power supply, is automatically centered between the positive and negative voltages on terminals 15 and 17.

The oscillator inverters are operated in the linear range of their transfer characteristics. The conductance of the two transistors of each inverter stage is varied during each cycle, but the two transistors are always conducting and providing a conduction path between P2 and N2.

Since the $V_Q$ of each stage of the oscillator is approximately midway between $V_{DD}$ and ground, maximum signal swing is enabled and the output of any inverter of the oscillator may be directly connected to the output buffer I4 which is operated directly from the higher supply voltage ($V_{DD}$ and ground). The switching point of each inverter is the same (half way between its applied operating potential) and the oscillator inverter outputs do not need to be level shifted in order to provide a symmetric drive to output buffer I4.

Curve H of FIG. 2 shows the frequency response of the circuit of FIG. 1 as a function of $V_C$. The full frequency range of the circuit may be in the order of 50MHz for a change in $V_C$ from 1.5 to 5 volts. The frequency of oscillation of the oscillator increases monotonically as a function of an increasing $V_C$ and decreases monotonically as a function of decreasing $V_C$. This may be observed from curve H which shows the frequency to be a single valued function of the control voltage.

In many applications it is desirable to limit the oscillation frequency range to a narrower band (e.g. from 16.5 to 17.5MHz) and also to have finer control over the amount of frequency change for a given change in $V_C$. This requires the flattening out of the frequency response curve. The inventors have found that a tuned circuit may be used in the circuit of FIG. 1 to shape its frequency response. Shown in FIG. 3 is an LC tank comprised of a capacitor C1 connected in parallel with an inductor L1. One end of the tank circuit is grounded and the other end is connected via decoupling capacitor C2 to node D which is common to the output of inverter I1 of FIG. 1. (Note that the tank circuit could instead be connected to the output of any other inverter, I2 or I3, in the oscillator ring).

The LC tank circuit of FIG. 3 is a parallel resonance frequency circuit whose point of resonance is adjusted to be just below the lowest frequency at which the oscillator is to operate. At resonance the tank circuit presents a relatively small load to the circuit. At frequencies above resonance, the tank circuit loads down the output and by-passes a portion of the control currents. This necessitates a greater change in $V_C$ and in the current through the inverter stage to change the oscillator frequency. Thus, fine control of the frequency change is achieved.

Curves I and J of FIG. 2 illustrate the effect of the tank circuit and also the effect of using different capacitance-inductance combinations in the tuned circuit. For a given LC product, the greater the capacitance, the flatter the frequency response curve. In curve I, $C_1$ was set to $C_{1A}$ = 50 picofarads and in curve J, $C_1$ was set to $C_{1B}$ = 250 picofarads. The value of the inductor $L_{1A}$, used in parallel with $C_{1A}$ was 5 times the value of the inductance ($L_{1B}$) placed in parallel with $C_{1B}$ such that $C_{1B} \times L_{1B} = C_{1A} \times L_{1A} = 2\pi$ times the resonant frequency. An examination of curves I and J indicates that, above resonance, the tuned circuit makes the frequency response an essentially linear function of the control voltage. Comparing curves I and J it is evident that the effect of increasing the capacitance functions to flatten out the frequency response. This is due to the capacitance presenting a greater load (i.e a lower impedance) above resonance. More than an order of magnitude improvement in "fine-control" has been demonstrated experimentally and the slope of frequency change versus $V_C$ is readily controlled by appropriate selection of the values of the individual components $C_1$ and $L_1$ as well as the product LC (i.e., the resonant frequency) as illustrated in FIG. 2.

The inventors have also found that still better performance can be obtained by energizing at least one of the inverter stages of the ring oscillator between fixed supply voltages rather than being operated between the current source P2 and the current sink N2. FIG. 4 shows inverter stage I1 being operated between the drains of P2 and N2, inverter stage I2A being operated between the drains of P2B and N2B and inverter stage I3A is operated directly between terminals 15 and 17. I1 and I2A could alternatively both be operated between the drains of a shared current source transistor and of a shared current sink transistor. In the specific configuration shown in FIG. 4, transistors P2B and N2B sourcing and sinking current to inverter I2A may also exhibit drain current versus source-to-gate voltage characteristics that are proportional to, rather than equal to, those of transistor P2 and N2. A frequency responsive load 41, which could be of the type shown in FIG. 3, is connected to the output of inverter I1.

The connection of at least one of the inverter stages in the ring oscillator to be powered from fixed supply potentials provides a basis for referring its output potential, as well as those of other inverter stages with which it is connected in loop, to these fixed supply potentials. One then does not need to rely on the current source and sink transistors exhibiting appreciable conductance—that is, upon them exhibiting appreciable departure in character from ideal infinite-source-impedance constant current generators—in order to obtain proper centering of the operating points of the inverter stages I1, I2A, I3A between ground and $+V_{DD}$ voltages.

Connecting inverter I3A directly between power supply lines 15 and 17 tends to maintain the quiescent points of the oscillator inverters approximately centered between $V_{DD}$ and ground even when the current sourcing and current sinking means (P2, N2 or P2B, N2B) are somewhat imbalanced.

What is claimed is:

1. The combination comprising:
   an oscillator, having two voltage terminals, whose output frequency varies as a function of the voltage applied across said two voltage terminals;
   first and second power terminals for the application therebetween of an operating voltage;
   a current source connected between said first power terminal and one of said two voltage terminals;
   a current sink connected between said second power terminal and the other one of said two voltage terminals;
   an input control terminal adapted to receive a control signal;
   control means coupled between the input control terminal and said current source and current sink responsive to the amplitude of the signal at said control terminal for maintaining the amplitude of the current through said current source substantially equal to that through said current sink for monotonically varying the amplitude of said current through said current source and sink and monotonically altering said oscillator output frequency as a function of said control signal.

2. The combination as claimed in claim 1 wherein said oscillator includes a plurality of cascaded inverter stages connected in a ring configuration; at least one inverting stage having a conduction path connected between said two voltage terminals and having an input and an output; said inverting stage being operated in the linear portion of its transfer characteristic and providing a continuous conduction path between said current source and current sink.

3. The combination as claimed in claim 2 wherein said current source includes a first (P2) insulated-gate field-effect transistor (IGFET) of P conductivity type having a control electrode, and a conduction path connected between said first power terminal and one of said two voltage terminals;

wherein said current sink includes a second (N2) IGFET of N conductivity type having a control electrode and a conduction path connected between said second power terminal and the other one of said two voltage terminals;

wherein said control means includes a third (P1) P type IGFET and a fourth (N1) N type IGFET; each IGFET having a control electrode and a conduction path; wherein the conduction paths of said third and fourth IGFETs being connected in series between said first and second power terminals; one end of said third IGFET being connected to said first power terminal and one end of said fourth IGFET being connected to said second power terminal;

wherein the control electrodes of said first and third IGFETs are connected to a point common to the conduction paths of said third and fourth IGFETs; and wherein the control electrode of said second and fourth IGFETs are connected in common to said input control terminal.

4. The combination as claimed in claim 2 wherein each one of said inverting stages is a complementary inverter comprised of one transistor of P conductivity type and another transistor of N conductivity type.

5. The combination as claimed in claim 4 wherein each one of said transistors is an insulated-gate field-effect transistor.

6. The combination as claimed in claim 4 wherein each one of said inverting stages has an output for producing signals varying about the quiescent point approximately midway between the operating voltages applied to said first and second power terminals in response to the signals at its input.

7. The combination as claimed in claim 6 further including a buffer having a signal input and a signal output, and powered directly by the voltages applied to said first and second power terminals; said buffer being directly connected at its input to the output of one of said inverting stages and producing signals at its output having a quiescent point approximately midway between the voltages applied to said first and second power terminals.

8. The combination as claimed in claim 2 further including a tank circuit; wherein said tank circuit is alternating current (a.c.) coupled to the output of one stage of said oscillator, said tank circuit having a resonant point set below the lowest frequency at which said oscillator is to operate.

* * * * *